(12) United States Patent
Lin et al.

(10) Patent No.: US 9,130,008 B2
(45) Date of Patent: Sep. 8, 2015

(54) ROBUST ESD PROTECTION WITH SILICON-CONTROLLED RECTIFIER

(71) Applicant: Taiwan Semiconductor Manufacturing Co. Ltd., Hsin-Chu (TW)

(72) Inventors: Chun-Yu Lin, Hsinchu (TW); Ming-Dou Ker, Zhubei (TW); Ming Hsien Tsai, New Taipei (TW); Li-Wei Chu, Hsinchu (TW); Ming-Hsiang Song, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 132 days.

(21) Appl. No.: 13/778,369

(22) Filed: Feb. 27, 2013

(65) Prior Publication Data

US 2015/0228770 A1    Aug. 13, 2015

Related U.S. Application Data

(60) Provisional application No. 61/758,868, filed on Jan. 31, 2013.

(51) Int. Cl.
*H01L 29/66* (2006.01)
*H01L 29/74* (2006.01)
*H01L 29/10* (2006.01)

(52) U.S. Cl.
CPC ........ *H01L 29/7424* (2013.01); *H01L 29/1012* (2013.01)

(58) Field of Classification Search
USPC .......... 257/173, 355, 357, 607; 438/133, 135, 438/154, 155
See application file for complete search history.

(56) References Cited

U.S. PATENT DOCUMENTS

| 2009/0206367 A1* | 8/2009 | Gauthier et al. | 257/173 |
| 2012/0319164 A1* | 12/2012 | Inaba | 257/173 |
| 2013/0229223 A1* | 9/2013 | Shrivastava et al. | 327/438 |

* cited by examiner

*Primary Examiner* — Errol Fernandes
(74) *Attorney, Agent, or Firm* — Eschweiler & Associates, LLC (57) ABSTRACT

Some embodiments relate to a silicon controlled rectifier (SCR) that includes a current path which couples an SCR anode to an SCR cathode. The current path includes a first vertical current path component coupled to the SCR anode, and a second vertical current path component coupled to the SCR cathode. A horizontal current path component includes a first well region and a second well region that meet at a junction lying along a first plane. The first and second well regions cooperatively span a distance between the first and second vertical current path components. The first and second vertical current path components mirror one another symmetrically about the first plane.

25 Claims, 8 Drawing Sheets

ROBUST ESD PROTECTION WITH SILICON-CONTROLLED RECTIFIER

CROSS REFERENCE TO RELATED APPLICATION

This application is a Non-Provisional Patent Application claiming priority to U.S. Provisional Patent Application Ser. No. 61/758,868 filed Jan. 31, 2013 entitled "Robust ESD Protection with Silicon-Controlled Rectifier" and is hereby incorporated by reference.

BACKGROUND

An electrostatic discharge (ESD) pulse is a sudden and unexpected transfer of energy to an electronic device from an outside body (as approximated by using a human body model (HBM) or machine model (MM)) or to an outside body from an electronic device (as approximated by using a charged device model (CDM)). ESD events can damage electronic devices, for example by "blowing out" a gate oxide of a transistor in cases of high voltage or by "melting" an active region area of a device in cases of high current, causing junction failure. If devices are damaged by an ESD event, the electronic product can be rendered less operable than desired, or can even be rendered inoperable altogether.

DETAILED DESCRIPTION

One or more implementations of the present invention will now be described with reference to the attached drawings, wherein like reference numerals are used to refer to like elements throughout. The drawings are not drawn to scale.

Figure 1A:
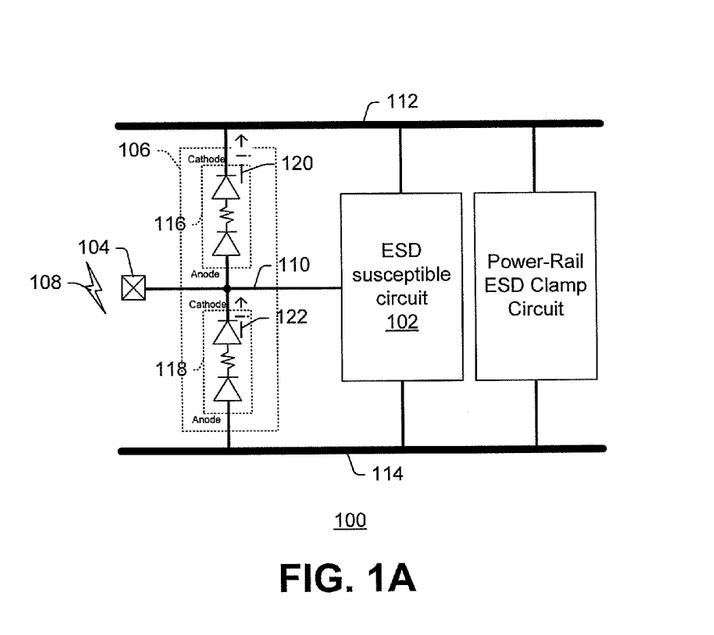
FIG. 1A shows an example of an integrated circuit that includes an ESD-susceptible circuit and an ESD protection circuit.

FIG. 1A shows an example of an integrated circuit (IC) 100 that includes an ESD-susceptible circuit 102, wherein in some embodiments an IC pin 104 electrically connect the ESD susceptible circuit 102 to an exterior circuit assembly (not shown). In some embodiments, the IC pin takes the form of a landing pad, solder bump, or other structure that provides electrical connection between the ESD susceptible circuit 102 and another circuit; and can interface to external circuits formed external to the IC 100 or can be arranged between circuit elements within IC 100. For example, in some embodiments the IC pin 104 is a supply pin that supplies a DC supply voltage (e.g., VDD or VSS) to the ESD susceptible circuit 102, or is an input/output (I/O) pin that transfers input or output signals there from.

To protect the circuit 102 from impingent ESD pulses 108, an ESD protection circuit 106 is included on IC 100. In particular, the ESD protection circuit 106 regulates the voltage on coupling node 110 to keep this voltage from rising above a level that will damage semiconductor devices in the ESD susceptible circuit 102. In some embodiments, this ESD protection circuit 106 clamps the voltages on coupling node 110 to just outside of maximum operating extremes. In some embodiments, the maximum voltage on 110 is clamped just above the rail voltage normally present on first power rail 112 (e.g., VDD), and the minimum voltage on 110 is clamped just below the zero volt line normally present on the second power rail 114 (e.g., VSS or ground).

Figure 1B:
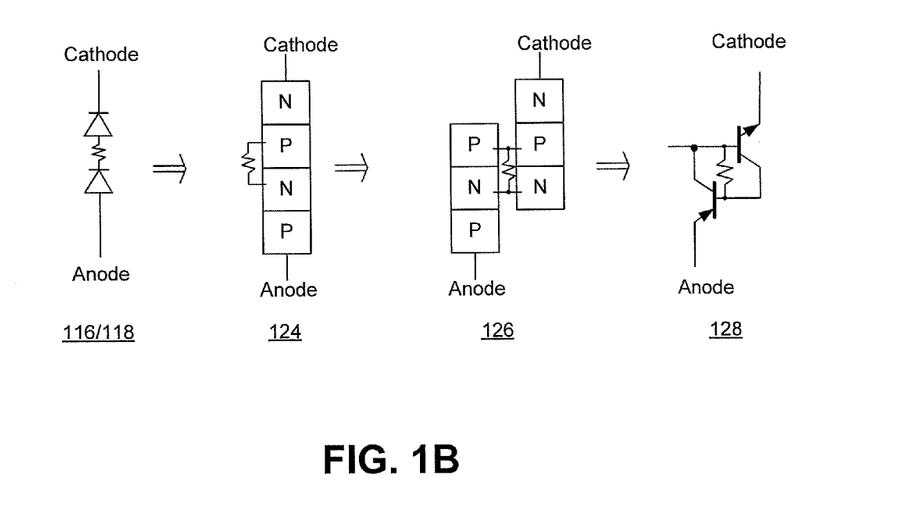
FIG. 1B shows different representations of a silicon-controlled rectifier (SCR) that is used in the ESD protection circuit of FIG. 1A in some embodiments.

In FIG. 1A's example, the ESD protection circuit 106 employs first and second SCRs 116, 118. The first SCR 116 is arranged between node 110 and first power rail 112, while the second SCR 118 is arranged between node 110 and second power rail 114. As shown in FIG. 1B, the first and second SCRs 116, 118 each have an anode and cathode, between which is a PNPN structure 124 that is represented as a pair of cross-coupled bipolar junction transistors (BJTs) 126 or 128 in some embodiments.

Under normal operating conditions in FIG. 1A (i.e., when no ESD pulses are present), the first and second SCRs 116, 118 are reverse biased. Therefore, under normal operating conditions, the first and second SCRs 116, 118 are non-conducting and power flows un-diverted from 102 to 104 (and/or vice versa). However when a large positive ESD pulse occurs on IC pin 104, it causes the input voltage on 110 to increase above the first rail voltage on 112; and the first SCR 116 becomes forward biased and shunts energy of ESD pulse 108 thereover (see arrow 120). Similarly, if a large negative ESD pulse occurs on IC pin 104, it causes the voltage on 110 to decrease below the ground voltage on 114; and the second SCR 118 becomes forward biased and shunts energy of ESD pulse 108 thereover (see arrow 122). Thus, the first and second SCRs 116, 118 selectively shunt current to dissipate energy of impingent ESD pulses, but do not significantly affect circuit operation in the absence of an ESD pulse. Unfortunately, in conventional ESD protection techniques, the clamping voltage and/or trigger voltage are higher than desirable. In view of these shortcomings, the present disclosure provides for schemes to lower the clamping and/or trigger voltages.

Figure 2A:
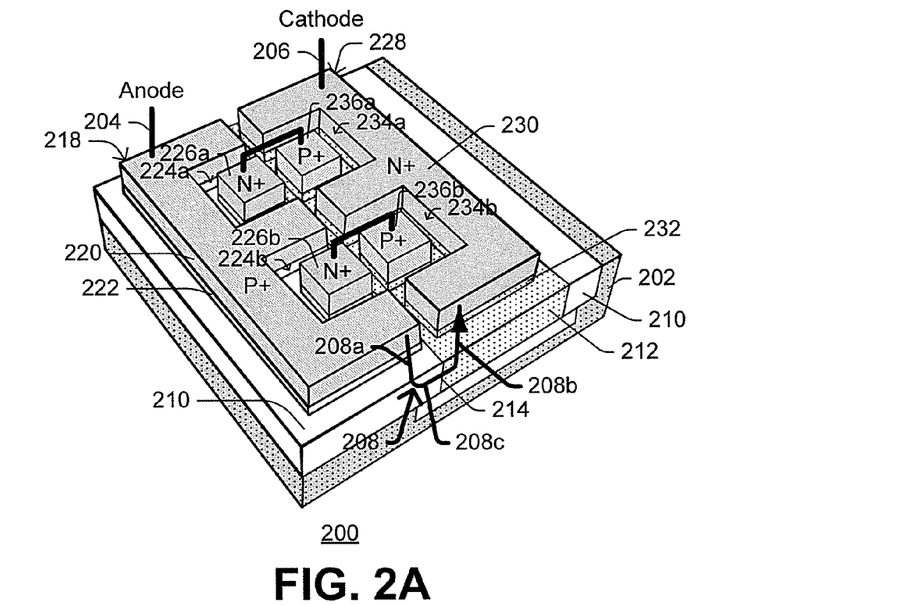
FIG. 2A shows a perspective view of an example SCR having w-shaped projections in accordance with some embodiments.
Figure 2B:
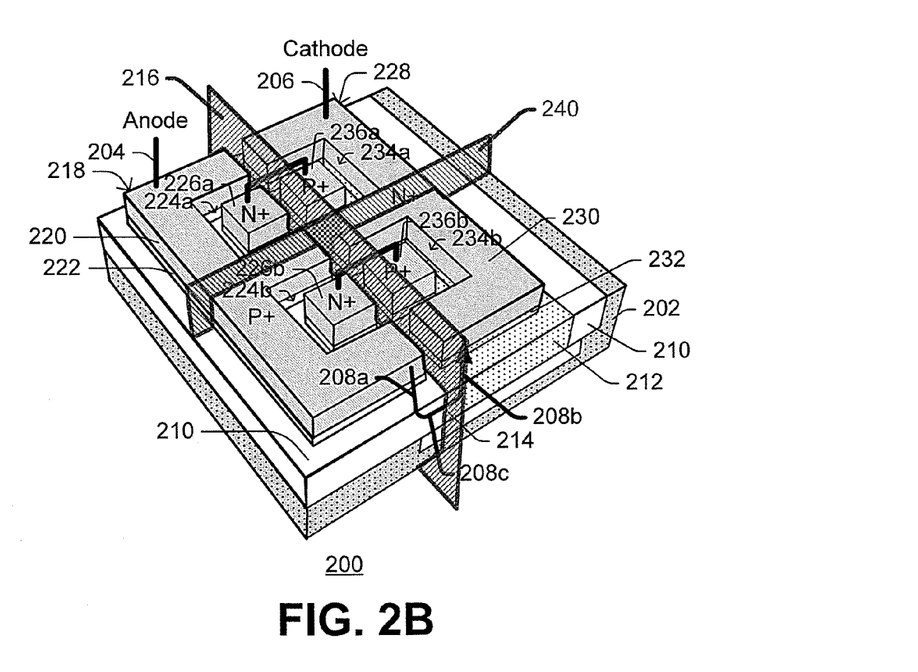
FIG. 2B shows the SCR of FIG. 2A with first and second planes of symmetry superimposed thereon.
Figure 4:
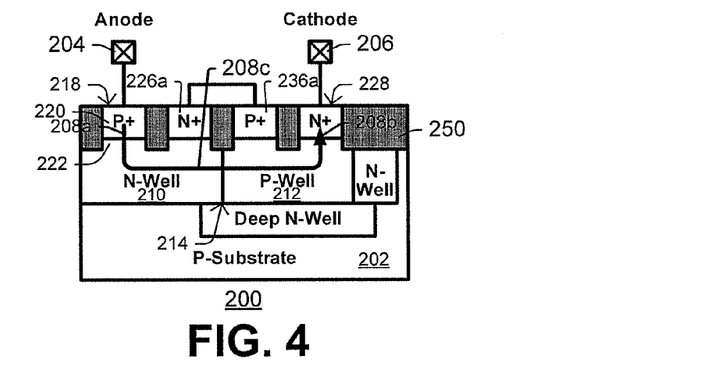
FIG. 4 shows a cross-sectional side view of some embodiments of an SCR as indicated in FIG. 3.
Figure 5:
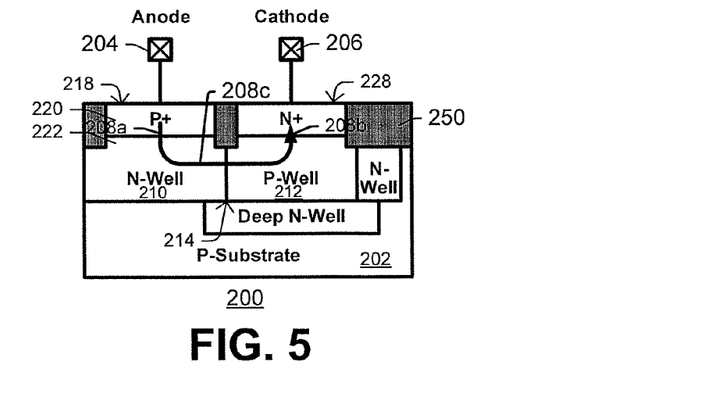
FIG. 5 shows a cross-sectional side view of some embodiments of an SCR as indicated in FIG. 3.

Turning now to FIGS. 2A-2B through FIG. 5, one can see an example SCR 200 that provides a lower clamping voltage and a lower trigger voltage than conventional SCR devices. Hence, when this SCR 200 is incorporated into an ESD protection circuit, such as a provided on IC 100 shown in FIG. 1A, the resultant circuit exhibits enhanced ESD robustness.

Referring to FIG. 2A, the SCR 200 is formed on a semiconductor substrate 202, such as a silicon substrate, silicon on insulator substrate, or another semiconductor substrate. The SCR 200 includes an SCR anode 204, an SCR cathode 206, and a current path 208 that is arranged to carry current from the SCR anode 204 to the SCR cathode 206. The current path 208 includes a first vertical current path component 208a; a second vertical current path component 208b which is spaced apart from the first vertical current path component 208a; and a horizontal current path component 208c which extends under the first and second vertical current path components and which electrically couples the first and second vertical current path components to one another. For clarity, dielectric regions have been removed in FIGS. 2A-2B (compare FIGS. 3-5, which show SCR 200 with dielectric regions 250 in place.)

The horizontal current path component 208c includes a first well region 210 and a second well region 212 which meet at a junction 214. The first well region 210 has a first conductivity type (e.g., n-type), while the second well region 212 has a second, opposite conductivity type (e.g., p-type). As illustrated in FIG. 2B, the junction 214 lies at least partially along a first plane 216.

Still referring to FIG. 2A, the first vertical current path component 208a is coupled to the SCR anode 204 and includes a first elongate semiconductor body with opposing sidewalls. The vertical current path component 208a includes a first w-shaped projection 218 extending vertically upwards from the substrate 202. This first w-shaped projection 218 includes an upper layer 220 having the second conductivity type (e.g., P+), and optionally includes a lower layer 222 which has the same doping as the first well region 210 (e.g., N) in the illustrated embodiment. In the illustrated embodiment, the first w-shaped projection 218 includes a pair of first vertical current path component recesses (224a, 224b), each of which extends inwardly from a sidewall of the first w-shaped projection 218. First well region contacts (226a, 226b, respectively) are arranged within the first vertical current path component recesses (224a, 224b, respectively). The first well region contacts 226a, 226b have the same doping type as the first well region 210 in some embodiments, although the first well region contacts 226a, 226b have a higher doping concentration (e.g., N+) in other embodiments.

The second vertical current path component 208b is coupled to the cathode 206 and includes a second elongate semiconductor body with opposing sidewalls. The vertical current path component 208b includes a second w-shaped projection 228 extending vertically upwards from the substrate 202. This second w-shaped projection 228 includes an upper layer 230 having the first conductivity type (e.g., N+), and optionally include a lower layer 232 which has the same doping as the second well region 212 (e.g., P) in the illustrated embodiment. In the illustrated embodiment, the second w-shaped projection 228 includes a pair of second vertical current path component recesses 234a, 234b, each of which extends inwardly from a sidewall of the second w-shaped projection 228. Second well region contacts (236a, 236b, respectively), are arranged within the second vertical current path component recesses (234a, 234b, respectively). In some embodiments, the second well region contacts 236a, 236b have the same doping type as the second well region 212. In some embodiments, the second well region contacts 236a, 236b have a higher doping concentration (e.g., P+) than the second well region 212. The second well contacts 236a, 236b are shorted to the first well region contacts (226a, 226b, respectively) in some embodiments, as shown.

As shown in FIG. 2B, the first vertical current path component 208a mirrors the second vertical current path component 208b symmetrically about first plane 216. The first and second vertical current path components 208a, 208b are also each symmetrical about a second plane 240, which runs perpendicular with the first plane 216. In some embodiments, the second plane 240 is arranged on central legs of w-shaped projections 218, 228 and is equidistant between first and second well region contacts 226a, 226b, for example.

Figure 3:
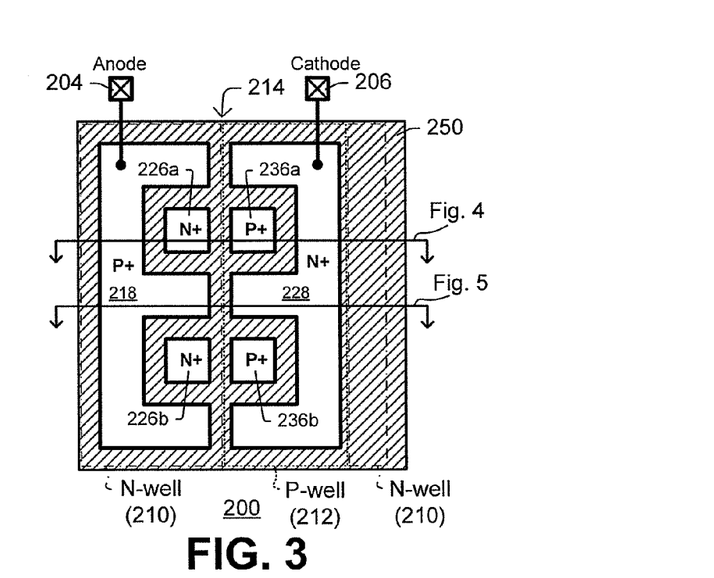
FIG. 3 shows a top layout view of the SCR of FIG. 2A including dielectric regions.

FIGS. 3-5 show additional views of the SCR 200 with an example doping arrangement. These additional views of the SCR 200 in FIGS. 3-5 depict the same regions and reference numerals as shown in FIGS. 2A-2B, albeit that FIGS. 3-5 show additional dielectric layer 250 which was removed from FIG. 2A-2B for clarity. For example, FIG. 3 shows anode 204; cathode 206; and n-well 210 and p-well 212 which meet at junction 214; as well as first and second w-shaped projections 218, 228, respectively. FIG. 4 shows a cross-sectional view as depicted in FIG. 3, and illustrates substrate 202; anode 204; cathode 206; and current path (208a, 208b, 208c); first well region 210; and second well region 212. FIG. 5 shows a cross-sectional view as depicted in FIG. 3; and illustrates substrate 202; anode 204; cathode 206; and current path (208a, 208b, 208c); first well region 210; and second well region 212. Although these additional views are depicted with n-type dopants used for the first conductivity type and p-type dopants used for the second conductivity, it will be appreciated that in other embodiments the first conductivity type is p-type and the second conductivity type is n-type. In other words, in some un-illustrated embodiments the conductivity labels in FIG. 3-5 are "flipped" and the same is true of other embodiments illustrated and/or described herein.

Figure 6A:
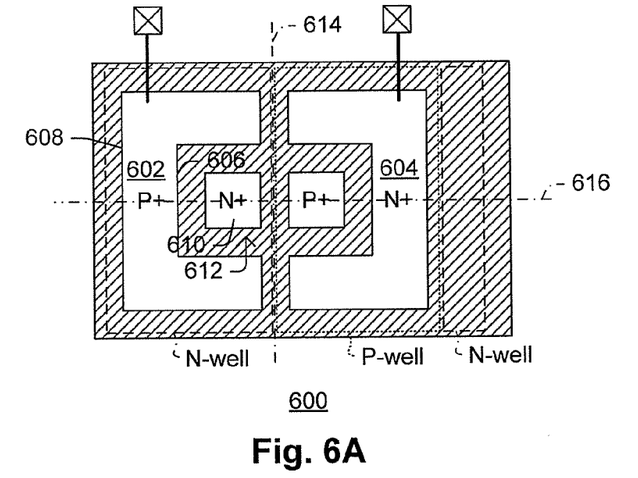
FIG. 6A shows another embodiment of an SCR that includes u-shaped projections that mirror each other symmetrically about a plane of symmetry.

Although FIGS. 2A-2B and 3-5 show the first and second vertical current path components 208a, 208b as w-shaped projections, the first and second vertical current path components take on a variety of shapes in other embodiments and are not limited to the shapes illustrated herein. For example, in an example SCR 600 illustrated in FIG. 6A, first and second vertical current path components are u-shaped projections (602, 604, respectively) extending vertically upwards from the substrate. Each u-shaped projection (e.g., 602) includes an inner u-shaped surface (e.g., 606) and an outer u-shaped surface (e.g., 608), which is concentric with regards to the inner u-shaped surface. A well contact (e.g., 610) is then formed in a recess (e.g., 612) defined by the inner u-shaped surface. Like the w-shaped projections in FIGS. 2A-2B, the u-shaped projections in FIG. 6A mirror one another symmetrically about first plane 614, and are each symmetric about second plane 616. F-shaped projections or 7T-shaped projections are present in some embodiments.

Figure 6B:
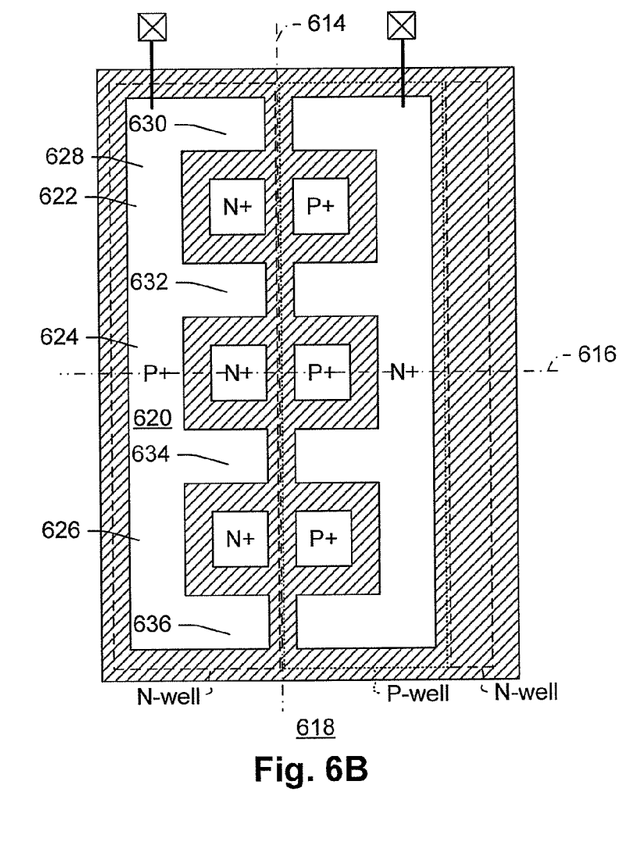
FIG. 6B shows another embodiment of an SCR that includes multiple u-shaped projections.

Further, as shown in the embodiment of FIG. 6B, multiple u-shaped (and/or w-shaped) projections are arranged adjacent to one another. For example, FIG. 6B shows an example SCR 618 where the first and second vertical current path components are each made up of three u-shaped projections. For example, first vertical current path component 620 includes first, second, and third u-shaped projections (622, 624, and 626). In FIG. 6B's example, adjacent u-shaped, or w-shaped projections have sidewalls that abut or merge with neighboring u-shaped, or w-shaped projections. The structure in FIG. 6B (and other similar structures described herein) can also be described with regards to a longitudinal member (e.g., 628) extending in parallel with the first plane 614, wherein transverse members (e.g., 630, 632, 634, 636) perpendicularly cross the longitudinal member at regular intervals. In the embodiment of FIG. 6B, these transverse members (e.g., legs or sides of the u-shaped or w-shaped projections) extend uni-directionally for the same distance from the longitudinal member 628; however, in other embodiments these transverse members extend in different directions from the longitudinal member and can have the same lengths or different lengths as one another. In addition, although four transverse members are illustrated as extending from longitudinal member 628 in FIG. 6B, it will be appreciated that any number of transverse members branch off of a longitudinal member in other embodiments.

Although this embodiment does tend to consume more area than the previously described implementations, this embodiment and others where additional u- or w-shaped projections are used may be advantageous depending on the device parameters and the energy of ESD pulses to be compensated for. Further, although the w-shaped and u-shaped projections have been illustrated as having "square" corners where multiple perpendicular faces meet up, in many process technologies the corners may be rounded and/or the faces may be slightly offset from perpendicular. For example, sidewalls may be "tilted" at slight non-perpendicular angles relative to the substrate surface.

Figure 7A:
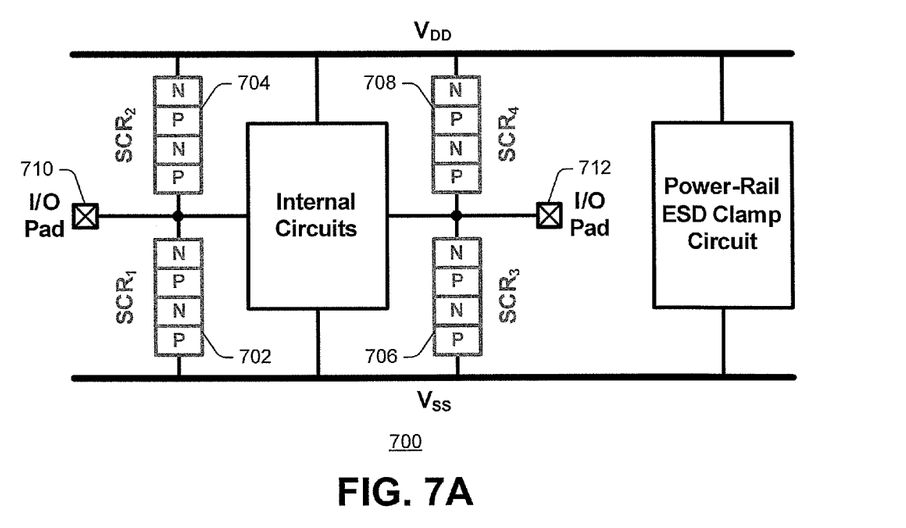
FIGS. 7A-7B show a circuit that includes four SCRs arranged with respect to a two IC pins to divert an ESD pulse impingent on one or more of the IC pins.
Figure 7B:
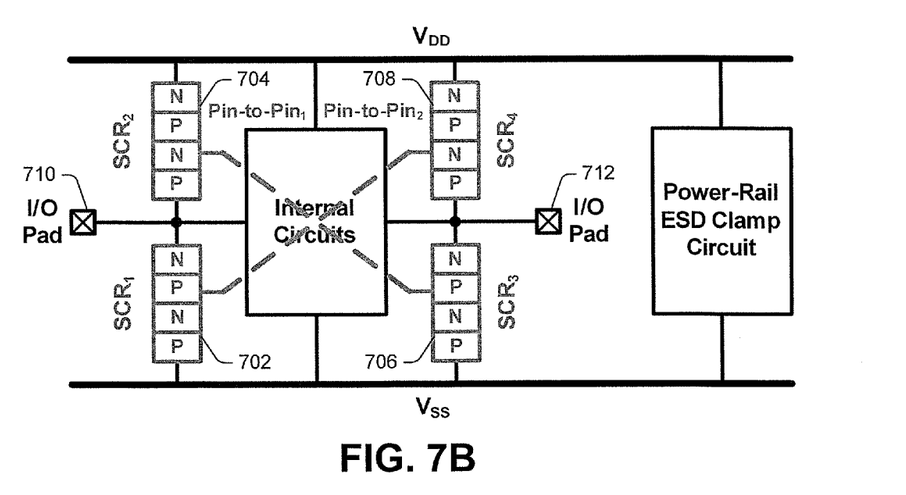

FIG. 7A shows another embodiment of an ESD protection device 700 that includes four SCRs (702, 704, 706, 708) arranged between first and second IC pins (710, 712). These four SCR devices, each of which is in the form of a PNPN structure, cooperatively dissipate energy of an impingent ESD pulse in this embodiment. As shown in FIG. 7B, each pin-to-pin path includes a diode string from the first I/O pin to the second I/O pin. For example, under some ESD conditions, current goes from the first I/O pin 710 through the second SCR device 704 and through a third SCR device 706 before exiting through the second I/O pin 712. Under other ESD conditions, current goes from the second I/O pin 712, through the fourth SCR device 708 and through a first SCR device 702 before exiting through the first I/O pin 710.

Figure 8:
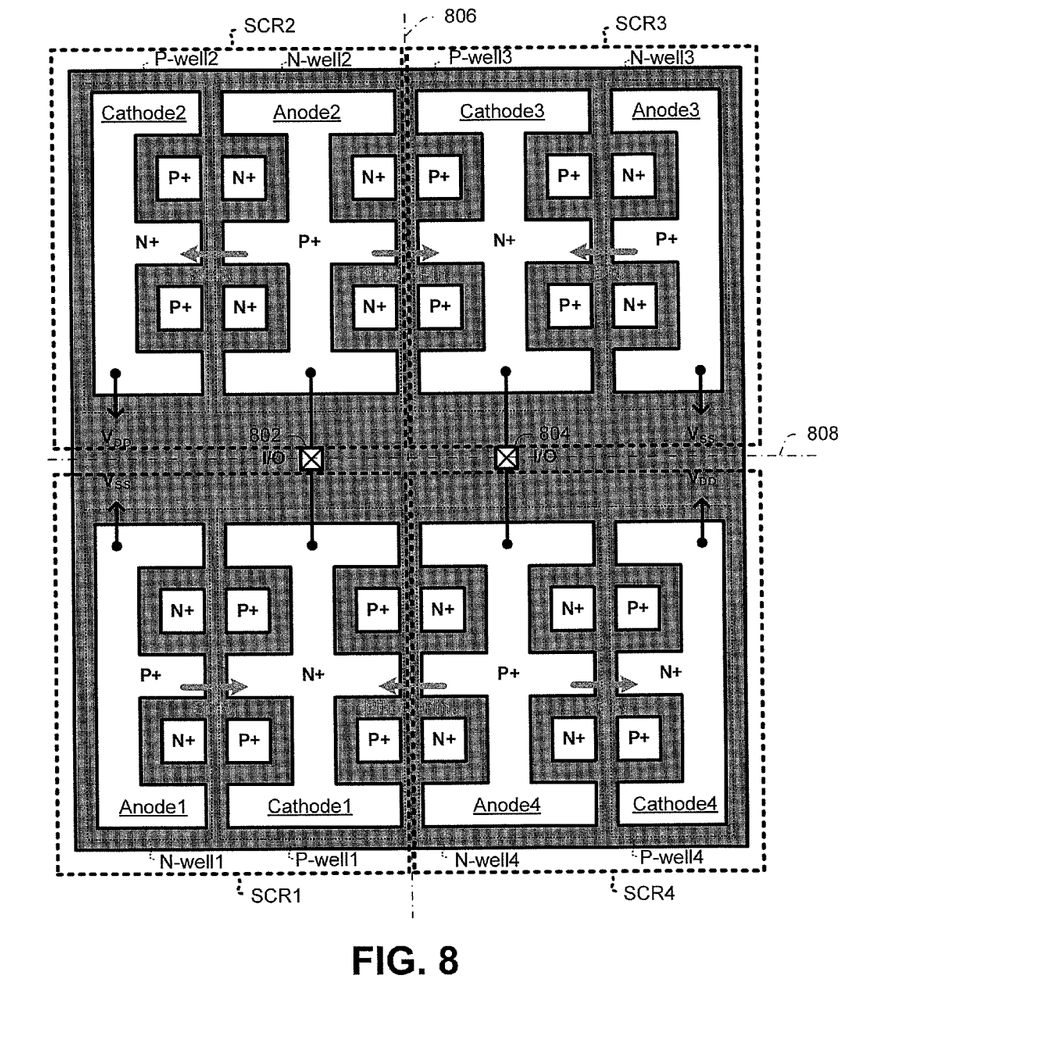
FIG. 8 shows a top layout view of an SCR corresponding to FIG. 7A's embodiment.

An improved layout for the ESD protection device of FIG. 7A is provided in FIG. 8. The ESD protection device 800 includes four SCRs (SCR1, SCR2, SCR3, SCR4), each of which includes a PNPN structure formed from one or more w-shaped projections extending vertically from a semiconductor substrate on which the ESD device is formed. The four SCRs are strategically arranged with regards to two I/O pins 802, 804. The cathode of the first SCR (Cathode1) is coupled to the first I/O pin 802, as is the anode of the second SCR (Anode2). The cathode of the third SCR (Cathode3) is coupled to the second I/O pin 804, as is the anode of the fourth SCR (Anode4). In FIG. 8's embodiment, the SCRs are arranged symmetrically about first and second planes 806, 808.

Each SCR includes a cathode (or anode) that has the shape of a single-w and also includes an anode (or cathode) that has the shape of a pair of w's arranged to mirror one another as they lie on their back. For example, the first SCR (SCR1) includes an anode having a first single-w, whose back runs parallel with the second plane 806. The first SCR also includes a cathode having a pair of w-shaped projections. The single w of the first SCR is arranged over a first n-well (N-well1) and the pair of w-shaped projections for the first SCR is arranged over a first p-well (P-well1). N+ doped n-well contacts are arranged in recesses in the w-shaped anode (Anode1); and P+ doped p-well contacts are arranged in recesses in the pair of w-shaped projections for the cathode of SCR1. The other SCRs are also arranged in a similar manner.

Figure 9:
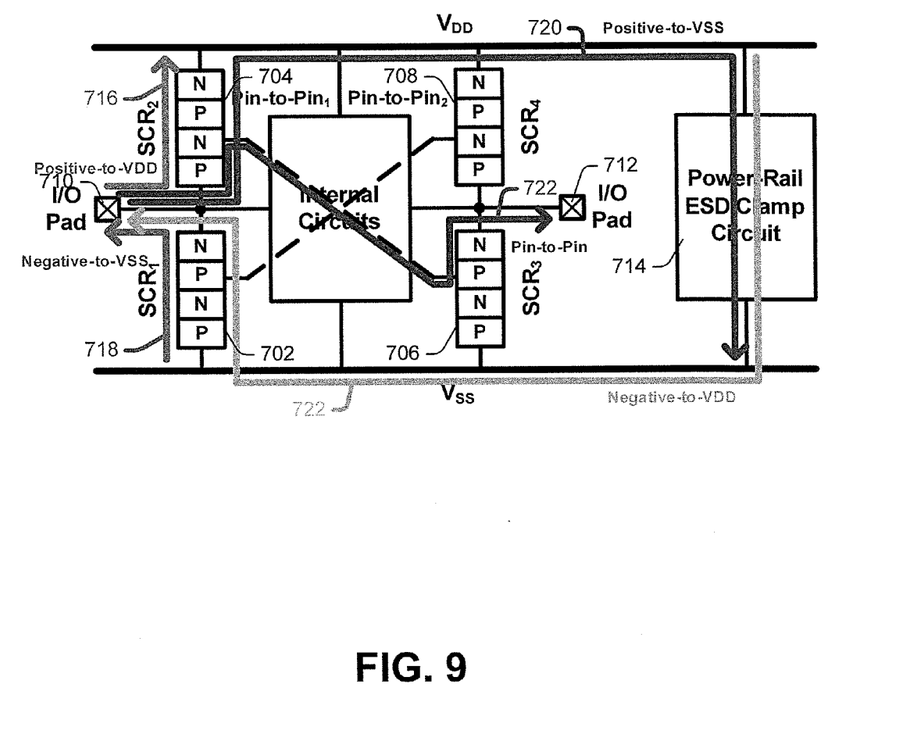
FIG. 9 shows some embodiments of how current can flow through an SCR.

FIG. 9 illustrates some different ESD conditions for which the ESD protection device of FIGS. 7A-7B can offer protection. As shown, if a positive-to-VDD type ESD pulse 716 is impingent, the ESD protection device 700 can divert the positive-to-VDD pulse through the second SCR 704 to the upper (VDD) rail. If a negative-to-VSS type ESD pulse 716 is impingent, the ESD protection device 700 can divert the negative-to-VSS pulse from the lower (VSS) rail through the first SCR 702 to the first I/O pad 710. If a positive-to-VSS type ESD pulse 720 is impingent, the ESD protection device 700 can divert the positive-to-VSS pulse 720 through the second SCR 704 and over the upper (VDD) rail before it is diverted over the Power Rail ESD clamp circuit 714. If a negative-to-VSS type ESD pulse 722 is impingent, the ESD protection device 700 can divert the negative-to-VSS pulse 722 over the Power Rail ESD clamp circuit 714 before it is routed along lower (VSS) rail and over the first SCR 702 out the first I/O pad 710. Finally, if a pin-to-pin type ESD pulse 724 is present, the ESD protection device 700 can divert the pin-to-pin type ESD pulse 724 over a diode in the second SCR 704, then over another diode in the third SCR 706 before the energy of pulse 724 is passed out second IC pin 712.

Figure 10:
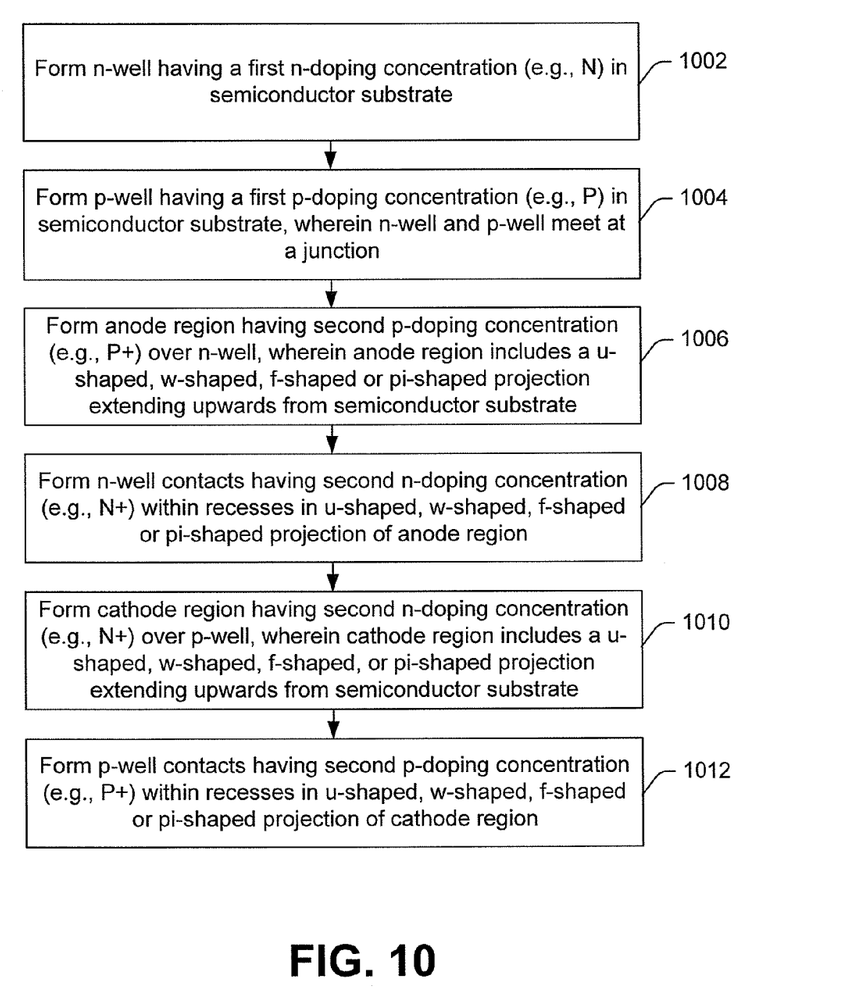
FIG. 10 shows a flow chart depicting some embodiments of a method of manufacturing an SCR to be used in an ESD protection circuit.

FIG. 10 illustrates some embodiments for a methodology of manufacturing an SCR suitable for an ESD protection circuit. Although this methodology is illustrated as a series of discrete blocks or acts, it will be appreciated that same of these acts or blocks are performed concurrently in some implementations and/or some acts or blocks can be broken into sub-acts or sub-blocks in some implementations. Further, in other embodiments the order of the acts or blocks varies from what is provided in the illustrated figure.

FIG. 10's methodology starts at 1002, wherein an n-well, which has a first n-doping concentration (e.g., N), is formed in a semiconductor substrate.

At 1004, p-well, which has a first p-doping concentration (e.g., P), is formed in the semiconductor substrate. The p-well meets the n-well at a junction which is aligned on a first plane.

In 1006, an anode region is formed over the n-well. The anode region has a second p-doping concentration (P+), which is greater than the first p-doping concentration. The anode region includes one or more u-shaped, w-shaped, F-shaped, or π-shaped projections extending upwards from the semiconductor substrate in some embodiments.

In 1008, one or more n-well contacts, which have a second n-doping concentration (e.g., N+), are formed within recesses in the u-shaped, w-shaped, F-shaped, or π-shaped projections of the anode region.

In 1010, a cathode region, which has a second n-doping concentration (e.g., N+), is formed over the p-well. The cathode region includes one or more u-shaped, w-shaped, F-shaped, or π-shaped projections extending upwards from the semiconductor substrate.

In 1012, one or more p-well contacts, which have a second p-doping concentration (e.g., P+), are formed within recesses in the u-shaped, w-shaped, F-shaped, or π-shaped projections of the cathode region.

Some embodiments relate to a silicon controlled rectifier (SCR) that includes a current path which couples an SCR anode to an SCR cathode. The current path includes a first vertical current path component coupled to the SCR anode, and a second vertical current path component coupled to the SCR cathode. A horizontal current path component includes a first well region and a second well region that meet at a junction lying along a first plane. The first and second well regions cooperatively span a distance between the first and second vertical current path components. The first and second vertical current path components mirror one another symmetrically about the first plane.

Some embodiments relate to an SCR formed on a substrate and including an SCR anode, an SCR cathode, and a current path to carry current from the SCR anode to the SCR cathode. The current path includes a first vertical current path component coupled to the SCR anode and having a first conductivity type. The current path also includes a second vertical current path component coupled to the SCR cathode and having a second conductivity type which is opposite the first conductivity type. The second vertical current path component is arranged horizontally in the same plane as the first vertical current path component, and is spaced apart horizontally from the first vertical current path component by a distance. The current path also includes a horizontal current path component which is arranged under the first and second vertical current path components and which spans the distance between the first and second vertical current path components. The horizontal current path component includes a first well region coupled to the first vertical current path component and having the second conductivity type. The horizontal current path component also includes a second well region coupled to the second vertical current path component and having the first conductivity type. The first and second wells meet at a junction lying along a first plane, and the first and second vertical current path components mirror one another symmetrically about the first plane.

It will be appreciated that identifiers such as "first" and "second" do not imply any type of ordering or placement with respect to other elements; but rather "first" and "second" and other similar identifiers are just generic identifiers. While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A silicon controlled rectifier (SCR) that includes a current path to carry current from an SCR anode to an SCR cathode; wherein the current path comprises:
    a first vertical current path component coupled to the SCR anode;
    a second vertical current path component coupled to the SCR cathode;
    a horizontal current path component arranged under the first and second vertical current path components, wherein the horizontal current path component includes a first well region and a second well region that meet at a junction lying along a first plane, wherein the first and second well regions cooperatively span a distance separating the first and second vertical current path components;
    at least one first well region contact electrically coupled to the first well region; and
    at least one second well region contact electrically coupled to the second well region and shorted to the at least one first well region contact.

2. The SCR of claim 1, wherein the first and second vertical current path components mirror one another symmetrically about the first plane.

3. The SCR of claim 1, further comprising
    at least one first vertical current path component recess extending inwardly from a sidewall of the first vertical current path component; and
    at least one second vertical current path component recess that extends inwardly from a sidewall of the second vertical current path component;
    wherein the at least one first vertical current path component recess and the at least one second vertical current path component recess mirror one another symmetrically about the first plane.

4. The SCR of claim 3, wherein
    the at least one first well region contact is disposed in the at least one first vertical current path component recess, the at least one first well region contact being electrically coupled to the first well region; and
    the at least one second well region contact is disposed in the at least one second vertical current path component recess, the at least one second well region contact being electrically coupled to the second well region.

5. The SCR of claim 1, wherein a second plane perpendicularly intersects the first plane such that the first and second vertical current path components are each symmetrical about the second plane.

6. The SCR of claim 5, wherein the SCR anode includes a plurality of u-shaped, f-shaped, π-shaped, or w-shaped projections, wherein adjacent u-shaped, f-shaped, π-shaped, or w-shaped projections have sidewalls that abut or merge with neighboring u-shaped, f-shaped, π-shaped, or w-shaped projections as the plurality of projections extend in parallel with the second plane.

7. The SCR of claim 1:
    wherein the first vertical current path component is a u-shaped, f-shaped, π-shaped, or w-shaped projection extending vertically upwards from a substrate on which the SCR is formed; and
    wherein the second vertical current path component is a u-shaped, f-shaped, π-shaped, or w-shaped projection extending vertically upwards from the substrate and mirroring the u-shaped, f-shaped, π-shaped, or w-shaped projection of the first vertical current path component about the first plane.

8. The SCR of claim 7, further comprising contacts arranged in recesses of the u-shaped, f-shaped, π-shaped, or w-shaped projections of the first and second vertical current path components.

9. The SCR of claim 1,
    wherein the first vertical current path component has a first conductivity type and the first well region has a second conductivity type which is opposite the first conductivity type.

10. The SCR of claim 9, wherein the first well region has the second conductivity type and the second well region has the first conductivity type.

11. The SCR of claim 1, wherein the SCR anode includes a plurality of u-shaped, f-shaped, π-shaped, or w-shaped projections, wherein adjacent u-shaped, f-shaped, π-shaped, or w-shaped projections have sidewalls that abut or merge with neighboring u-shaped, f-shaped, π-shaped, or w-shaped projections.

12. A silicon controlled rectifier (SCR) formed on a substrate and including an SCR anode, an SCR cathode, and a current path that is arranged to carry current from the SCR anode to the SCR cathode; wherein the current path comprises:
   a first vertical current path component coupled to the SCR anode and having a first conductivity type;
   a second vertical current path component coupled to the SCR cathode and having a second conductivity type which is opposite the first conductivity type, wherein the second vertical current path component is arranged horizontally in the same plane as the first vertical current path component and is spaced apart horizontally from the first vertical current path component by a distance; and
   a horizontal current path component arranged under the first and second vertical current path components and spanning the distance between the first and second vertical current path components, the horizontal current path component including:
      a first well region arranged under and coupled to the first vertical current path component, wherein the first well region has the second conductivity type; and
      a second well region arranged under and coupled to the second vertical current path component, wherein the first and second well regions meet at a junction aligned on a first plane and wherein the second well region has the first conductivity type;
      wherein the first and second vertical current path components mirror one another symmetrically about the first plane over an entire length of the junction on the first plane.

13. The SCR of claim 12, wherein the first vertical current path component is an elongate semiconductor body having opposing sidewalls.

14. The SCR of claim 13, wherein the elongate semiconductor body includes an upper layer having the first conductivity type and a lower layer having the second conductivity type.

15. The SCR of claim 14, further comprising:
   dielectric regions adjacent to the semiconductor body and flanking the opposing sidewalls.

16. The SCR of claim 15, further comprising:
   at least one first well region contact coupled to the first well region and shorted to at least one second well region contact coupled to the second well region.

17. The SCR of claim 12, wherein a second plane perpendicularly intersects the first plane such that the first and second vertical current path components are each symmetrical about the second plane.

18. The SCR of claim 12:
   wherein the first vertical current path component is a u-shaped, f-shaped, π-shaped, or w-shaped projection extending vertically upwards from the substrate; and
   wherein the second vertical current path component is a u-shaped, f-shaped, π-shaped, or w-shaped projection extending vertically upwards from the substrate and mirroring the u-shaped, f-shaped, π-shaped, or w-shaped projection of the first vertical current path component about the first plane.

19. The SCR of claim 18, further comprising contacts arranged in recesses of the u-shaped, f-shaped, π-shaped, or w-shaped projections of the first and second vertical current path components.

20. The SCR of claim 12, further comprising:
   at least one first well region contact electrically coupled to the first well region; and
   at least one second well region contact electrically coupled to the second well region and shorted to the at least one first well region contact.

21. A silicon controlled rectifier (SCR) that includes a current path to carry current from an SCR anode to an SCR cathode; wherein the current path comprises:
   a first vertical current path component coupled to the SCR anode;
   a second vertical current path component coupled to the SCR cathode;
   a horizontal current path component arranged under the first and second vertical current path components, wherein the horizontal current path component includes a first well region and a second well region that meet at a junction lying along a first plane, wherein the first and second well regions cooperatively span a distance separating the first and second vertical current path components;
   wherein at least one of the first vertical current path component or the second vertical current path component is a u-shaped, f-shaped, π-shaped, or w-shaped projection extending vertically upwards from a substrate on which the SCR is disposed.

22. The SCR of claim 21, the other of the first vertical current path component and the second vertical current path component is a u-shaped, f-shaped, π-shaped, or w-shaped projection extending vertically upwards from the substrate and mirroring the u-shaped, f-shaped, π-shaped, or w-shaped projection of the at least one of the first vertical current path component or the second vertical current path about the first plane.

23. The SCR of claim 21, wherein a second plane perpendicularly intersects the first plane such that the first and second vertical current path components are each symmetrical about the second plane.

24. The SCR of claim 21, further comprising:
   at least one first well region contact electrically coupled to the first well region; and
   at least one second well region contact electrically coupled to the second well region and shorted to the at least one first well region contact.

25. The SCR of claim 24, wherein the first and second well region contacts are arranged in recesses of the u-shaped, f-shaped, π-shaped, or w-shaped projections of the first and second vertical current path components.

* * * * *